United States Patent
Ge et al.

(10) Patent No.: US 9,634,032 B2
(45) Date of Patent: Apr. 25, 2017

(54) MANUFACTURE METHOD OF DUAL GATE OXIDE SEMICONDUCTOR TFT SUBSTRATE AND STRUCTURE THEREOF

(71) Applicant: Shenzhen China Star Optoelectronics Technology Co., Ltd., Shenzhen (CN)

(72) Inventors: Shimin Ge, Shenzhen (CN); Hejing Zhang, Shenzhen (CN); Chihyuan Tseng, Shenzhen (CN); Chihyu Su, Shenzhen (CN); Wenhui Li, Shenzhen (CN); Longqiang Shi, Shenzhen (CN); Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/763,822

(22) PCT Filed: May 21, 2015

(86) PCT No.: PCT/CN2015/079476
§ 371 (c)(1),
(2) Date: Jul. 28, 2015

(87) PCT Pub. No.: WO2016/165186
PCT Pub. Date: Oct. 20, 2016

(65) Prior Publication Data
US 2016/0307932 A1    Oct. 20, 2016

(30) Foreign Application Priority Data
Apr. 14, 2015  (CN) .......................... 2015 1 0175711

(51) Int. Cl.
*H01L 21/44*  (2006.01)
*H01L 27/12*  (2006.01)
(Continued)

(52) U.S. Cl.
CPC ...... *H01L 27/1225* (2013.01); *H01L 21/0274* (2013.01); *H01L 21/02565* (2013.01);
(Continued)

(58) Field of Classification Search
CPC .......... H01L 27/1225; H01L 21/02565; H01L 21/02631
(Continued)

(56) References Cited

U.S. PATENT DOCUMENTS

| | | | | |
|---|---|---|---|---|
| 7,273,773 B2* | 9/2007 | Yamazaki | ............ | G09G 3/3225 257/E21.414 |
| 7,847,287 B2* | 12/2010 | Kim | ................ | H01L 21/823462 257/360 |
| 7,940,085 B2* | 5/2011 | Kim | .................... | H01L 27/0883 326/26 |
| 8,575,618 B2* | 11/2013 | Maekawa | ......... | H01L 29/41733 257/40 |
| 8,907,335 B2* | 12/2014 | Yamazaki | ............... | H01L 27/12 257/43 |
| 8,907,348 B2* | 12/2014 | Miyairi | ............... | H01L 27/1225 257/258 |
| 9,029,851 B2* | 5/2015 | Miyairi | ............... | H01L 27/1225 257/43 |
| 9,087,745 B2* | 7/2015 | Yamazaki | ........... | H01L 27/1225 |
| 9,318,512 B2* | 4/2016 | Miyairi | ................. | H01L 21/477 |
| 9,324,874 B2* | 4/2016 | Yamazaki | ........... | H01L 27/1225 |
| 9,466,756 B2* | 10/2016 | Yamazaki | .......... | H01L 27/1214 |
| 9,496,406 B2* | 11/2016 | Yamazaki | ........... | H01L 27/1225 |
| 2005/0082968 A1* | 4/2005 | Choi | .................... | G09G 3/3225 313/506 |

(Continued)

*Primary Examiner* — Caleb Henry
(74) *Attorney, Agent, or Firm* — Leong C. Lei (57) ABSTRACT

The present invention provides a manufacture method of an oxide semiconductor TFT substrate and a structure thereof. The manufacture method of the dual gate oxide semiconductor TFT substrate utilizes the halftone mask to implement one photo process, which cannot only accomplish the patterning to the oxide semiconductor layer but also obtain the oxide conductor layer (53') with ion doping process; the method implements the patterning process to the bottom gate isolation layer (31) and the top gate isolation layer (32) at the same time with one photo process; the method manufactures the first top gate (71), the first source (81), the first drain (82), the second top gate (72), the second source (83), the second drain (84) at the same time with one photo process; the method implements patterning process to the flat layer (9), the passivation layer (8) and the top gate isolation layer (32) at the same time with one photo process, to reduce the number of the photo processes to five for (Continued)

shortening the manufacture procedure, raising the production efficiency and lowering the production cost.

7 Claims, 5 Drawing Sheets (51) Int. Cl.
  H01L 21/02 (2006.01)
  H01L 21/027 (2006.01)
  H01L 21/467 (2006.01)
  H01L 29/24 (2006.01)
  H01L 29/45 (2006.01)
  H01L 29/49 (2006.01)
  H01L 29/51 (2006.01)
  H01L 29/66 (2006.01)
  H01L 29/786 (2006.01)
  H01L 51/52 (2006.01)
  H01L 27/32 (2006.01)

(52) U.S. Cl.
  CPC ...... *H01L 21/02631* (2013.01); *H01L 21/467* (2013.01); *H01L 27/1288* (2013.01); *H01L 29/24* (2013.01); *H01L 29/45* (2013.01); *H01L 29/495* (2013.01); *H01L 29/4908* (2013.01); *H01L 29/518* (2013.01); *H01L 29/66969* (2013.01); *H01L 29/7869* (2013.01); *H01L 29/78648* (2013.01); *H01L 51/5206* (2013.01); *H01L 27/3248* (2013.01); *H01L 27/3262* (2013.01)

(58) Field of Classification Search
  USPC .......................................................... 257/40
  See application file for complete search history.

(56) References Cited

U.S. PATENT DOCUMENTS

| 2007/0152217 | A1* | 7/2007 | Lai | H01L 27/1225 |
| | | | | 257/59 |
| 2007/0272948 | A1* | 11/2007 | Koo | H01L 27/12 |
| | | | | 257/206 |
| 2008/0099759 | A1* | 5/2008 | Fujii | H01L 51/0022 |
| | | | | 257/40 |
| 2009/0189148 | A1* | 7/2009 | Araumi | H01L 27/283 |
| | | | | 257/40 |
| 2010/0084651 | A1* | 4/2010 | Yamazaki | H01L 27/1225 |
| | | | | 257/43 |
| 2010/0102313 | A1* | 4/2010 | Miyairi | H01L 27/1225 |
| | | | | 257/43 |
| 2010/0102314 | A1* | 4/2010 | Miyairi | H01L 29/42384 |
| | | | | 257/43 |
| 2010/0252826 | A1* | 10/2010 | Yamazaki | H01L 27/12 |
| | | | | 257/43 |
| 2010/0301326 | A1* | 12/2010 | Miyairi | H01L 27/1225 |
| | | | | 257/43 |
| 2016/0268437 | A1* | 9/2016 | Yamazaki | H01L 29/4908 |

* cited by examiner

MANUFACTURE METHOD OF DUAL GATE OXIDE SEMICONDUCTOR TFT SUBSTRATE AND STRUCTURE THEREOF

FIELD OF THE INVENTION

The present invention relates to a display technology field, and more particularly to a manufacture method of a dual gate oxide semiconductor TFT substrate and a structure thereof applicable for the OLED.

BACKGROUND OF THE INVENTION

The flat panel display devices possess many merits of thin frame, power saving, no radiation, etc. and have been widely used. The present flat panel display devices at present mainly comprise the Liquid Crystal Display (LCD) and the Organic Light Emitting Display (OLED).

The thin film transistor (TFT) is an important component of the flat panel display device. The TFTs can be formed on a glass substrate and a plastic substrate and generally employed as switch elements and driving elements utilized such as flat panel displays, LCDs, OLEDs and et cetera.

The oxide semiconductor TFT technology is the most popular skill at present. Because the oxide semiconductor has higher electron mobility and in comparison with the Low Temperature Poly-silicon (LTPS), the oxide semiconductor manufacture process is simpler and possesses higher compatibility with the amorphous silicon process, it can be applicable to the skill fields of LCD, OLED flat panel display devices and etc. Because it fits the new generation production lines and has possible applications for displays with Large, Middle and Small sizes. The oxide semiconductor has the great opportunity of application development.

At present, in the active array flat panel display device, the TFT substrate generally utilizes the single-gate oxide semiconductor thin film transistor (Single-Gate TFT). The dual gate oxide semiconductor thin film transistor (Dual-Gate) possesses better performance than the single gate oxide semiconductor thin film transistor, For example, the electron mobility is higher, and the current of activation state is larger, and the subthreshold swing is smaller, and the stability and the uniformity of the threshold voltage are better, and the gate voltage bias and the light stability are better.

Figure 1:
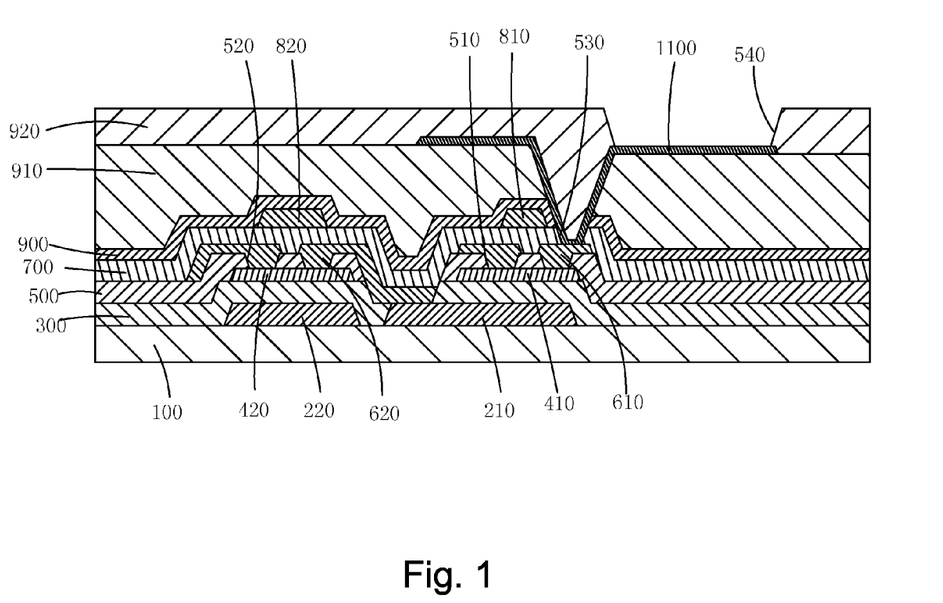
FIG. 1 is a sectional diagram of a structure of a dual gate oxide semiconductor TFT substrate applicable for the OLED according to prior art.

In the OLED display device, the importance of the threshold voltage is significant. The stable, uniform threshold voltage can make the display brightness of the OLED be more even and the display quality be higher. As shown in FIG. 1, a structure of a dual gate oxide semiconductor TFT substrate applicable for the OLED according to prior art comprises a substrate 100, a first bottom gate 210 and a second bottom gate 220 on the substrate 100, a gate isolation layer 300 on the substrate 100 and the first bottom gate 210 and the second bottom gate 220, a first oxide semiconductor layer 410 and a second oxide semiconductor layer 420 on the gate isolation layer 300 respectively above the first bottom gate 210 and the second bottom gate 220, an etching stopper layer 500 on the first oxide semiconductor layer 410, the second oxide semiconductor layer 420 and the gate isolation layer 300, a first source/a first drain 610 and a second source/a second drain 620 on the etching stopper layer 500, a passivation layer 700 on the first source/the first drain 610, the second source/the second drain 620 and the etching stopper layer 500, a first top gate 810 on the passivation layer 700 above the first source/the first drain 610, a second top gate 820 on the passivation layer 700 above the second source/the second drain 620, an interlayer insulation layer

2

900 on the first top gate 810, the second top gate 820 and the passivation layer 700, a first flat layer 910 on the interlayer insulation layer 900, an ITO anode 1100 on the first flat layer 910 and a second flat layer 920 on the ITO anode 1100 and the first flat layer 910.

The etching stopper layer 500 is formed with two first via holes 510 correspondingly above the first oxide semiconductor layer 410, and is formed with two second via holes 520 correspondingly above the second oxide semiconductor layer 420, and the first source/the first drain 610 and the second source/the second drain 620 respectively contact with the first oxide semiconductor layer 410 and the second oxide semiconductor layer 420 through the first via holes 510 and the second via holes 520; the passivation layer 700, the interlayer insulation layer 900 and the first flat layer 910 are formed with a third via hole 530 correspondingly above the first source/the first drain 610, and the ITO anode 1100 contacts with the first source/the first drain 610 through the third via hole 530; the second flat layer 920 is formed with a fourth via hole 540 correspondingly above the ITO anode 1100 to expose a portion of the ITO anode 1100.

As manufacturing the dual gate oxide semiconductor TFT substrate, except the substrate 100, every other structure layer is implemented with the pattern process with one photo process. Thus, the number of the required photo processes is more. Obviously, the structure of the dual gate oxide semiconductor TFT substrate applicable for the OLED is more complicated. The procedure of the manufacture method is longer, and the production efficiency is lower, and the production cost is higher.

SUMMARY OF THE INVENTION

An objective of the present invention is to provide a manufacture method of a dual gate oxide semiconductor TFT substrate applicable for the OLED, capable of reducing the number of the photo processes, shortening the manufacture procedure, raising the production efficiency and lowering the production cost.

An objective of the present invention is to provide a structure of a dual gate oxide semiconductor TFT substrate applicable for the OLED, capable of reducing the number of the photo processes, shortening the manufacture procedure, raising the production efficiency and lowering the production cost.

For realizing the aforesaid objectives, the present invention provides a manufacture method of a dual gate oxide semiconductor TFT substrate, comprising steps of:

step 1, providing a substrate, and deposing a first metal layer on the substrate, and implementing pattern process to the first metal layer with a first photo process to form a first bottom gate and a second bottom gate;

step 2, deposing a bottom gate isolation layer on the first bottom gate, the second bottom gate and the substrate;

step 3, deposing an oxide semiconductor layer on the bottom gate isolation layer, and coating a photoresist layer on the oxide semiconductor layer, and employing a halftone mask to implement a second photo process: first, implementing exposure, development to the photoresist layer to obtain a first photoresist layer, a second photoresist layer covering the oxide semiconductor layer respectively above the first bottom gate and the second bottom gate, and a third photoresist layer covering the oxide semiconductor layer at one side of the first bottom gate away from the second bottom gate; a thickness of two side areas of the first photoresist layer, a thickness of two side areas of the second photoresist layer and a thickness of the third photoresist layer are smaller than a thickness of a middle area of the first photoresist layer and a thickness of a middle area of the second photoresist layer;

employing the first photoresist layer, the second photoresist layer, and the third photoresist layer to implement etching the oxide semiconductor layer for patterning the oxide semiconductor layer to respectively obtain a first oxide semiconductor layer, a second oxide semiconductor layer respectively above the first bottom gate, the second bottom gate and a third oxide semiconductor layer at the one side of the first bottom gate away from the second bottom gate;

step 4, first, removing the two side areas of the first photoresist layer, the two side areas of the second photoresist layer and the third photoresist layer; employing the remaining middle area of the first photoresist layer and the remaining middle area of the second photoresist layer as being a mask layer to implement ion doping to the two side areas of the first oxide semiconductor layer, the two side areas of the second oxide semiconductor layer and the third oxide semiconductor layer, to transform the two side areas of the first oxide semiconductor layer and the two side areas of the second oxide semiconductor layer to be a conductor, and to transform the third oxide semiconductor layer to be an oxide conductor layer; then, removing the remaining middle area of the first photoresist layer and the remaining middle area of the second photoresist layer;

step 5, deposing a top gate isolation layer on the first oxide semiconductor layer, the second oxide semiconductor layer, the oxide conductor layer and the bottom gate isolation layer, and implementing pattern process to the top gate isolation layer and the bottom gate isolation layer with a third photo process, to respectively form first via holes above the two side areas of the first oxide semiconductor layer, second via holes above the two side areas of the second oxide semiconductor layer, a third via hole above the oxide conductor layer and a fourth via hole between the first bottom gate and the second bottom gate to expose a portion of the first bottom gate;

step 6, deposing second, third metal layers on the top gate isolation layer, and implementing pattern process to the second, third metal layers with a fourth photo process, to respectively obtain a first top gate above the first oxide semiconductor layer, a first source and a first drain at two sides of the first top gate, a second top gate above the second oxide semiconductor layer and a second source and a second drain at two sides of the second top gate;

the first source and the first drain respectively contact with the two side areas of the first oxide semiconductor layer through the first via holes, and the second source and the second drain respectively contact with the two side areas of the second oxide semiconductor layer through the second via holes, and the first source contacts with the oxide conductor layer through the third via hole and the second source contacts with the first bottom gate through the fourth via hole;

step 7, deposing a passivation layer on the first top gate, the first source, the first drain, the second top gate, the second source, the second drain and the top gate isolation layer;

step 8, deposing a flat layer on the passivation layer, and implementing patterning process to the flat layer, the passivation layer and the top gate isolation layer at the same time with a fifth photo process to obtain a fifth via hole above the oxide conductor layer to expose a portion of the oxide conductor layer to define a shape of a light emitting layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

The step 3 utilizes physical vapor deposition for deposing the transparent oxide semiconductor layer.

The step 5 utilizes dry etching for implementing pattern process to the top gate isolation layer and the bottom gate isolation layer at the same time.

Material of the oxide semiconductor layer is IGZO.

Material of the flat layer is organic photoresist.

Material of the first bottom gate, the first top gate, the first source, the first drain, the second bottom gate, the second top gate, the second source and the second drain is a stack combination of one or more of molybdenum, titanium, aluminum and copper.

Material of the bottom gate isolation layer and the top gate isolation layer is Silicon Nitride, Silicon Oxide, or a combination of the two. The present invention further provides a structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, a first oxide semiconductor layer positioned on the bottom gate isolation layer above the first bottom gate, a second oxide semiconductor layer positioned on the bottom gate isolation layer above the second bottom gate, an oxide conductor layer positioned on the bottom gate isolation layer at one side of the first bottom gate away from the second bottom gate, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a flat layer positioned on the passivation layer;

two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the flat layer are provided with a fifth via hole correspondingly above the oxide conductor layer;

the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

Material of the first oxide semiconductor layer and the second oxide semiconductor layer is IGZO, and the oxide conductor layer is manufactured by implementing ion doping to the IGZO semiconductor layer.

Material of the flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

The present invention further provides a structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, a first oxide semiconductor layer positioned on the bottom gate isolation layer above the first bottom gate, a second oxide semiconductor layer positioned on the bottom gate isolation layer above the second bottom gate, an oxide conductor layer positioned on the bottom gate isolation layer at one side of the first bottom gate away from the second bottom gate, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a flat layer positioned on the passivation layer;

two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the flat layer are provided with a fifth via hole correspondingly above the oxide conductor layer;

the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED;

wherein material of the first oxide semiconductor layer and the second oxide semiconductor layer is IGZO, and the oxide conductor layer is manufactured by implementing ion doping to the IGZO semiconductor layer;

wherein material of the flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

The benefits of the present invention are: the manufacture method of the dual gate oxide semiconductor TFT substrate provided by the present invention utilizes the halftone mask to implement one photo process, which cannot only accomplish the patterning to the oxide semiconductor layer but also obtain the oxide conductor layer with ion doping process, and the oxide conductor layer is employed as being the anode of the OLED to replace the ITO anode in prior art; the method implements the patterning process to the bottom gate isolation layer and the top gate isolation layer at the same time with one photo process; the method manufactures the first top gate, the first source, the first drain, the second top gate, the second source, the second drain at the same time with one photo process; the method implements patterning process to the flat layer, the passivation layer and the top gate isolation layer at the same time with one photo process, to reduce the number of the photo processes to five for shortening the manufacture procedure, raising the production efficiency and lowering the production cost. The aforesaid structure of the dual gate oxide semiconductor TFT substrate positions the oxide conductor layer to be the anode of the OLED, and the method positions all of the first source, the first drain, the second source, the second drain, the first top gate and the second top gate on the top gate isolation layer to simplify the structure of the TFT substrate on one hand and to reduce the number of the photo processes for shortening the manufacture procedure, raising the production efficiency and lowering the production cost on the other hand.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
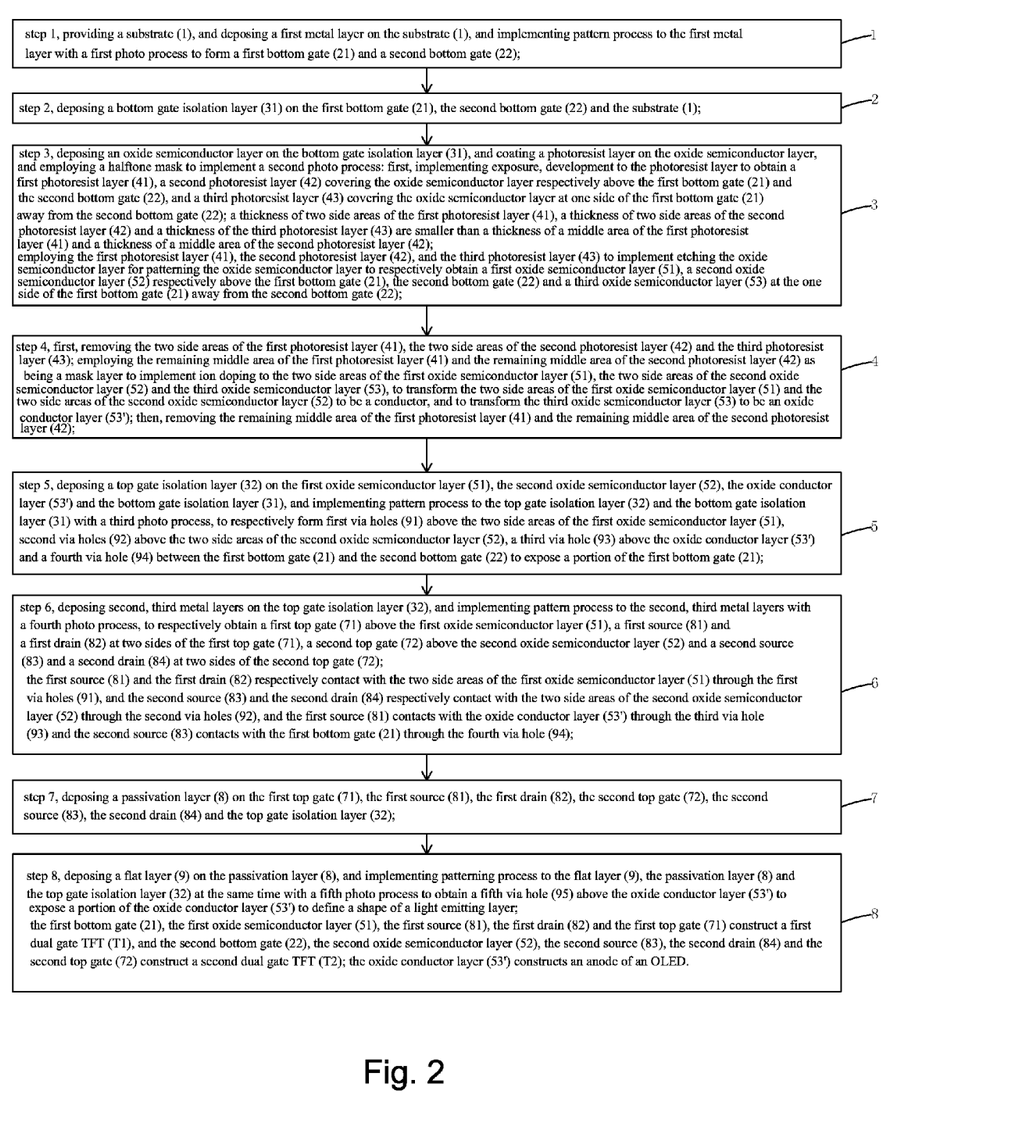
FIG. 2 is a flowchart of a manufacture method of a dual gate oxide semiconductor TFT substrate according to the present invention.
Figure 3:
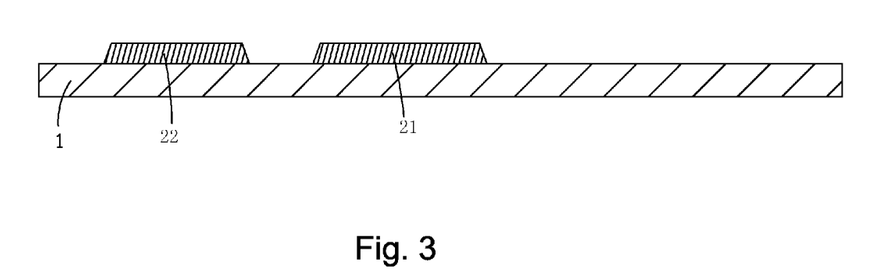
FIG. 3 is a diagram of step 1 of the manufacture method of the dual gate oxide semiconductor TFT substrate according to the present invention.

Please refer to FIG. 2. The present invention first provides a manufacture method of a dual gate oxide semiconductor TFT substrate applicable for the OLED, comprising steps of:

step 1, referring to FIG. 3, providing a substrate 1, and deposing a first metal layer on the substrate 1, and implementing pattern process to the first metal layer with a first photo process to form a first bottom gate 21 and a second bottom gate 22;

Specifically, the substrate 1 is a transparent substrate. Preferably, the substrate 1 is a glass substrate.

Figure 4:
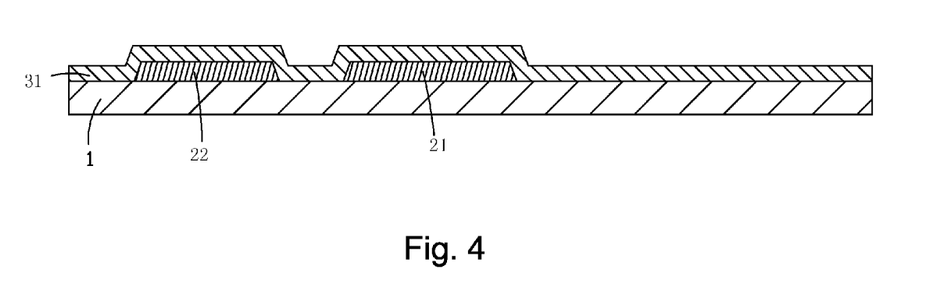
FIG. 4 is a diagram of step 2 of the manufacture method of the dual gate oxide semiconductor TFT substrate according to the present invention.

Material of the first metal layer is a stack combination of one or more of one or more of molybdenum (Mo), titanium (Ti), aluminum (Al) and copper (Cu). That is to say, material of the first bottom gate 21 and the second bottom gate 22 is a stack combination of one or more of molybdenum, titanium, aluminum and copper.

step 2, referring to FIG. 4, deposing a bottom gate isolation layer 31 on the first bottom gate 21, the second bottom gate 22 and the substrate 1.

Figure 5:
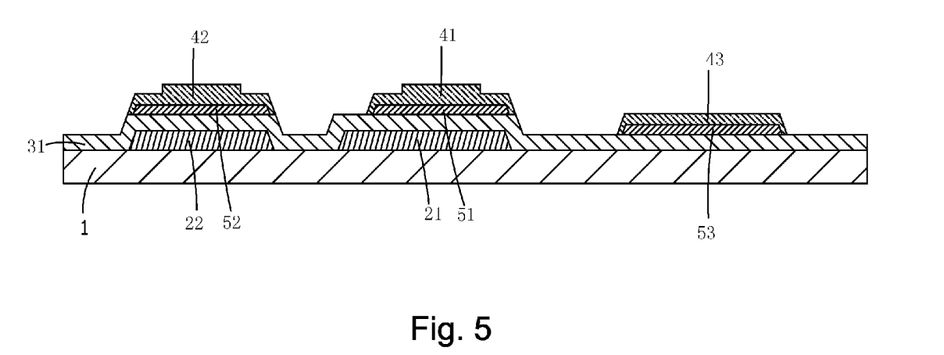
FIG. 5 is a diagram of step 3 of the manufacture method of the dual gate oxide semiconductor TFT substrate according to the present invention.

Specifically, material of the bottom gate isolation layer 31 is Silicon Nitride (SiNx), Silicon Oxide (SiOx), or a combination of the two.

step 3, referring to FIG. 5, deposing an oxide semiconductor layer on the bottom gate isolation layer 31, and coating a photoresist layer on the oxide semiconductor layer, and employing a halftone mask to implement a second photo process: first, implementing exposure, development to the photoresist layer to obtain a first photoresist layer 41, a second photoresist layer 42 covering the oxide semiconductor layer respectively above the first bottom gate 21 and the second bottom gate 22, and a third photoresist layer 43 covering the oxide semiconductor layer at one side of the first bottom gate 21 away from the second bottom gate 22; a thickness of two side areas of the first photoresist layer 41, a thickness of two side areas of the second photoresist layer 42 and a thickness of the third photoresist layer 43 are smaller than a thickness of a middle area of the first photoresist layer 41 and a thickness of a middle area of the second photoresist layer 42;

employing the first photoresist layer 41, the second photoresist layer 42, and the third photoresist layer 43 to implement etching the oxide semiconductor layer for patterning the oxide semiconductor layer to respectively obtain a first oxide semiconductor layer 51, a second oxide semiconductor layer 52 respectively above the first bottom gate 21, the second bottom gate 22 and a third oxide semiconductor layer 53 at the one side of the first bottom gate 21 away from the second bottom gate 22.

Specifically, the step 3 utilizes physical vapor deposition (PVD) for deposing the oxide semiconductor layer.

Figure 6:
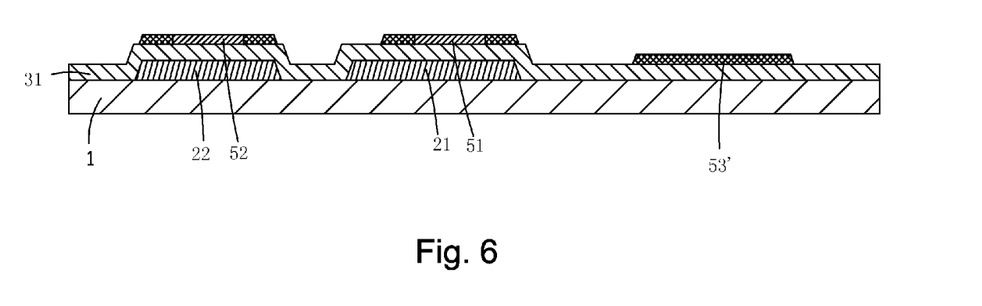
FIG. 6 is a diagram of step 4 of the manufacture method of the dual gate oxide semiconductor TFT substrate according to the present invention.
Figure 7:
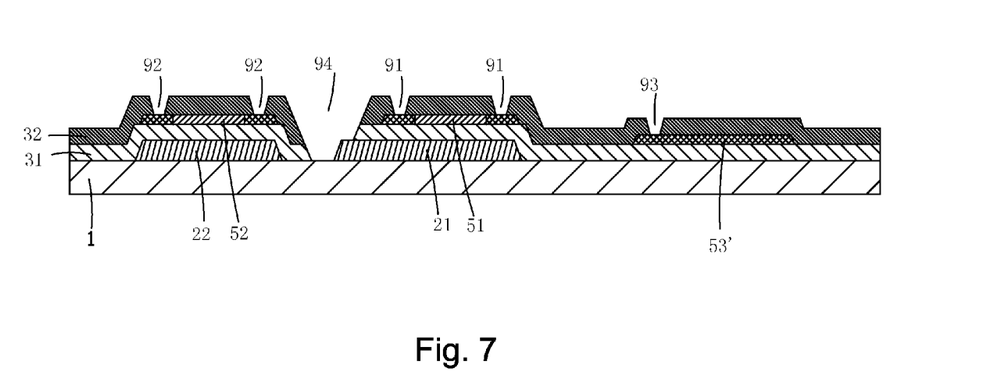
FIG. 7 is a diagram of step 5 of the manufacture method of the dual gate oxide semiconductor TFT substrate according to the present invention.

Material of the oxide semiconductor layer is Indium Gallium Zinc Oxide (IGZO).

step 4, referring to FIG. 6, first, removing the two side areas of the first photoresist layer 41, the two side areas of the second photoresist layer 42 and the third photoresist layer 43; employing the remaining middle area of the first photoresist layer 41 and the remaining middle area of the second photoresist layer 42 as being a mask layer to implement ion doping to the two side areas of the first oxide semiconductor layer 51, the two side areas of the second oxide semiconductor layer 52 and the third oxide semiconductor layer 53, to transform the two side areas of the first oxide semiconductor layer 51 and the two side areas of the second oxide semiconductor layer 52 to be a conductor, and to transform the third oxide semiconductor layer 53 to be an oxide conductor layer 53'; then, removing the remaining middle area of the first photoresist layer 41 and the remaining middle area of the second photoresist layer 42.

step 5, referring to FIG. 7, deposing a top gate isolation layer 32 on the first oxide semiconductor layer 51, the second oxide semiconductor layer 52, the oxide conductor layer 53' and the bottom gate isolation layer 31, and implementing pattern process to the top gate isolation layer 32 and the bottom gate isolation layer 31 with a third photo process, to respectively form first via holes 91 above the two side areas of the first oxide semiconductor layer 51, second via holes 92 above the two side areas of the second oxide semiconductor layer 52, a third via hole 93 above the oxide conductor layer 53' and a fourth via hole 94 between the first bottom gate 21 and the second bottom gate 22 to expose a portion of the first bottom gate 21.

Specifically, the step 5 utilizes dry etching for implementing pattern process to the top gate isolation layer 32 and the bottom gate isolation layer 31 at the same time.

Figure 8:
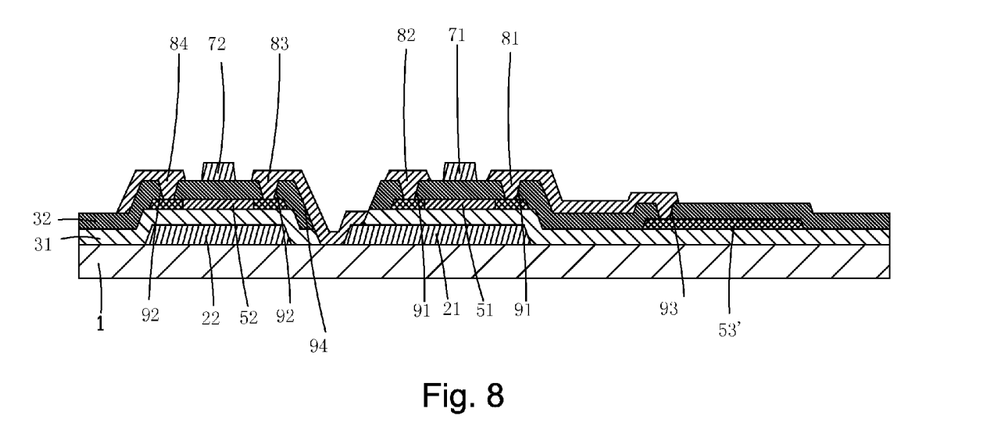
FIG. 8 is a diagram of step 6 of the manufacture method of the dual gate oxide semiconductor TFT substrate according to the present invention.

Material of the top gate isolation layer 32 is Silicon Nitride, Silicon Oxide, or a combination of the two.

step 6, referring to FIG. 8, deposing second, third metal layers on the top gate isolation layer 32, and implementing pattern process to the second, third metal layers with a fourth photo process, to respectively obtain a first top gate 71 above the first oxide semiconductor layer 51, a first source 81 and a first drain 82 at two sides of the first top gate 71, a second top gate 72 above the second oxide semiconductor layer 52 and a second source 83 and a second drain 84 at two sides of the second top gate 72.

The first source 81 and the first drain 82 respectively contact with the two side areas of the first oxide semiconductor layer 51 through the first via holes 91, and the second source 83 and the second drain 84 respectively contact with the two side areas of the second oxide semiconductor layer 52 through the second via holes 92, and the first source 81 contacts with the oxide conductor layer 53' through the third via hole 93 and the second source 83 contacts with the first bottom gate 21 through the fourth via hole 94.

Figure 9:
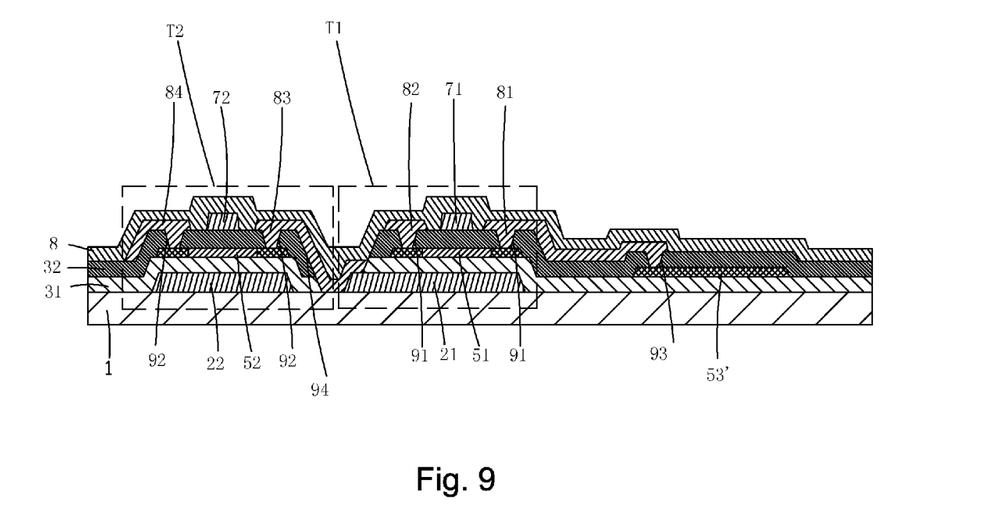
FIG. 9 is a diagram of step 7 of the manufacture method of the dual gate oxide semiconductor TFT substrate according to the present invention.
Figure 10:
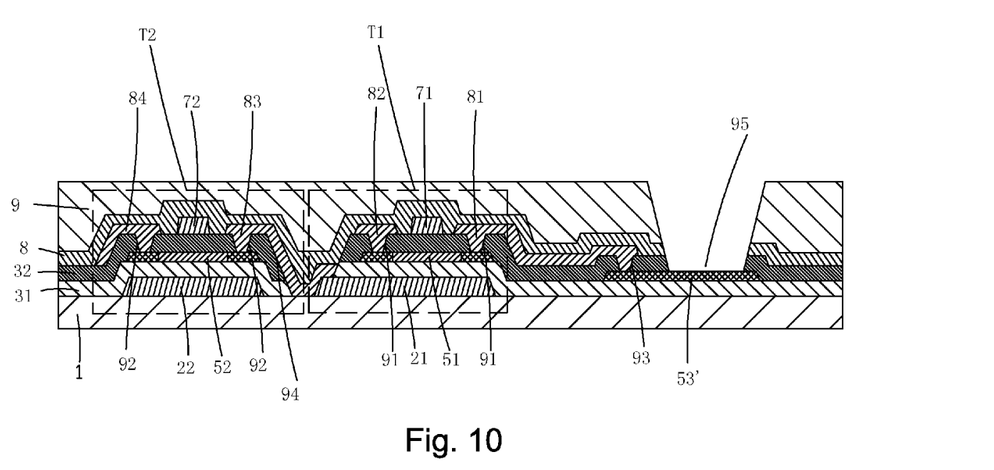
FIG. 10 is a diagram of step 8 of the manufacture method of the dual gate oxide semiconductor TFT substrate according to the present invention and a sectional diagram of a structure of a dual gate oxide semiconductor TFT substrate according to the present invention.

Specifically, material of the second, third metal layers is a stack combination of one or more of one or more of molybdenum, titanium, aluminum and copper. That is to say, material of the first top gate 71, the first source 81, the first drain 82, the second top gate 72, the second source 83 and the second drain 84 is a stack combination of one or more of molybdenum, titanium, aluminum and copper.

step 7, referring to FIG. 9, deposing a passivation layer 8 on the first top gate 71, the first source 81, the first drain 82, the second top gate 72, the second source 83, the second drain 84 and the top gate isolation layer 32.

step 8, referring to FIG. 10, deposing a flat layer 9 on the passivation layer 8, and implementing patterning process to the flat layer 9, the passivation layer 8 and the top gate isolation layer 32 at the same time with a fifth photo process to obtain a fifth via hole 95 above the oxide conductor layer 53' to expose a portion of the oxide conductor layer 53' to define a shape of a light emitting layer.

The first bottom gate 21, the first oxide semiconductor layer 51, the first source 81, the first drain 82 and the first top gate 71 construct a first dual gate TFT T1, and the second bottom gate 22, the second oxide semiconductor layer 52, the second source 83, the second drain 84 and the second top gate 72 construct a second dual gate TFT T2; the oxide conductor layer 53' constructs an anode of an OLED.

The aforesaid manufacture method of the dual gate oxide semiconductor TFT substrate utilizes the halftone mask to implement one photo process, which cannot only accomplish the patterning to the oxide semiconductor layer but also obtain the oxide conductor layer 53' with ion doping process; the method implements the patterning process to the bottom gate isolation layer 31 and the top gate isolation layer 32 at the same time with one photo process; the method manufactures the first top gate 71, the first source 81, the first drain 82, the second top gate 72, the second source 83, the second drain 84 at the same time with one photo process; the method implements patterning process to the flat layer 9, the passivation layer 8 and the top gate isolation layer 32 at the same time with one photo process, to reduce the number of the photo processes to five for shortening the manufacture procedure, raising the production efficiency and lowering the production cost.

Please refer to FIG. 10. The present invention further provides a structure of a dual gate oxide semiconductor TFT substrate applicable for the OLED, comprising a substrate 1, a first bottom gate 21 and a second bottom gate 22 positioned on the substrate 1, a bottom gate isolation layer 31 positioned on the substrate 1 and the first bottom gate 21 and the second bottom gate 22, a first oxide semiconductor layer 51 positioned on the bottom gate isolation layer 31 above the first bottom gate 21, a second oxide semiconductor layer 52 positioned on the bottom gate isolation layer 31 above the second bottom gate 22, an oxide conductor layer 53' positioned on the bottom gate isolation layer 31 at one side of the first bottom gate 21 away from the second bottom gate 22, a top gate isolation layer 32 positioned on the first oxide semiconductor layer 51, the second oxide semiconductor layer 52, the oxide conductor layer 53' and the bottom gate isolation layer 31, a first top gate 71 positioned on the top gate isolation layer 32 above the first oxide semiconductor layer 51, a first source 81 and a first drain 82 positioned on the top gate isolation layer 32 respectively at two sides of the first top gate 71, a second top gate 72 positioned on the top gate isolation layer 32 above the second oxide semiconductor layer 52, a second source 83 and a second drain 84 positioned on the top gate isolation layer 32 respectively at two sides of the second top gate 72, a passivation layer 8 positioned on the first top gate 71, the first source 81, the first drain 82, the second top gate 72, the second source 83, the second drain 84 and the top gate isolation layer 32, and a flat layer 9 positioned on the passivation layer 8.

Two areas of the first oxide semiconductor layer 51 and two areas of the second oxide semiconductor layer 52 are ion doping conductor layers; the top gate isolation layer 32 is provided with first via holes 91 correspondingly above the two side areas of the first oxide semiconductor layer 51, and is provided with second via holes 92 correspondingly above the two side areas of the second oxide semiconductor layer 52, and is provided with a third via hole 93 correspondingly above the oxide conductor layer 53'; the bottom gate isolation layer 31 and the top gate isolation layer 32 are provided with a fourth via hole 94 correspondingly between the first bottom gate 21 and the second bottom gate 22; the top gate isolation layer 32, the passivation layer 8 and the flat layer 9 are provided with a fifth via hole 95 correspondingly above the oxide conductor layer 53'.

The first source 81 and the first drain 82 respectively contact with the two side areas of the first oxide semiconductor layer 51 through the first via holes 91; the second source 83 and the second drain 84 respectively contact with the two side areas of the second oxide semiconductor layer 52 through the second via holes 92; the first source contacts 81 with the oxide conductor layer 53' through the third via hole 93; the second source 83 contacts with the first bottom gate 21 through the fourth via hole 94; the fifth via hole 95 exposes a portion of the oxide conductor layer 53'.

The first bottom gate 21, the first oxide semiconductor layer 51, the first source 81, the first drain 82 and the first top gate 71 construct a first dual gate TFT T1, and the second bottom gate 22, the second oxide semiconductor layer 52, the second source 83, the second drain 84 and the second top gate 72 construct a second dual gate TFT T2; the oxide conductor layer 53' constructs an anode of an OLED.

Material of the first oxide semiconductor layer 51 and the second oxide semiconductor layer 52 is IGZO, and the oxide conductor layer 53' is manufactured by implementing ion doping to the IGZO semiconductor layer.

Material of the flat layer 9 is organic photoresist; material of the bottom gate isolation layer 31 and the top gate isolation layer 32 is Silicon Nitride, Silicon Oxide, or a combination of the two; material of the first bottom gate 21, the first top gate 71, the first source 81, the first drain 82, the second bottom gate 22, the second top gate 72, the second source 83 and the second drain 84 is a stack combination of one or more of molybdenum, titanium, aluminum and copper.

The aforesaid structure of the dual gate oxide semiconductor TFT substrate positions the oxide conductor layer 53' to be the anode of the OLED, and the method manufactures the oxide conductor layer 53' and the first, second oxide semiconductors 51, 52 with one photo process; the method positions all of the first top gate 71, the first source 81, the first drain 82, the second top gate 72, the second source 83 and the second drain 84 on the top gate isolation layer 32 to simplify the structure of the TFT substrate on one hand and to reduce the number of the photo processes for shortening the manufacture procedure, raising the production efficiency and lowering the production cost on the other hand.

In conclusion, the manufacture method of the dual gate oxide semiconductor TFT substrate provided by the present invention utilizes the halftone mask to implement one photo process, which cannot only accomplish the patterning to the oxide semiconductor layer but also obtain the oxide conductor layer with ion doping process, and the oxide conductor layer is employed as being the anode of the OLED to replace the ITO anode in prior art; the method implements the patterning process to the bottom gate isolation layer and the top gate isolation layer at the same time with one photo process; the method manufactures the first top gate, the first source, the first drain, the second top gate, the second source, the second drain at the same time with one photo process; the method implements patterning process to the flat layer, the passivation layer and the top gate isolation layer at the same time with one photo process, to reduce the number of the photo processes to five for shortening the manufacture procedure, raising the production efficiency and lowering the production cost. The structure of the dual gate oxide semiconductor TFT substrate of the present invention positions the oxide conductor layer to be the anode of the OLED, and the method positions all of the first source, the first drain, the second source, the second drain, the first top gate and the second top gate on the top gate isolation layer to simplify the structure of the TFT substrate on one hand and to reduce the number of the photo processes for shortening the manufacture procedure, raising the production efficiency and lowering the production cost on the other hand.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a dual gate oxide semiconductor TFT substrate, comprising steps of:
   step 1, providing a substrate, and depositing a first metal layer on the substrate, and implementing pattern process to the first metal layer with a first photo process to form a first bottom gate and a second bottom gate;
   step 2, depositing a bottom gate isolation layer on the first bottom gate, the second bottom gate and the substrate;
   step 3, depositing an oxide semiconductor layer on the bottom gate isolation layer, and coating a photoresist layer on the oxide semiconductor layer, and employing a halftone mask to implement a second photo process: first, implementing exposure, development to the photoresist layer to obtain a first photoresist layer, a second photoresist layer covering the oxide semiconductor layer respectively above the first bottom gate and the second bottom gate, and a third photoresist layer covering the oxide semiconductor layer at one side of the first bottom gate away from the second bottom gate; a thickness of two side areas of the first photoresist layer, a thickness of two side areas of the second photoresist layer and a thickness of the third photoresist layer are smaller than a thickness of a middle area of the first photoresist layer and a thickness of a middle area of the second photoresist layer;

employing the first photoresist layer, the second photoresist layer, and the third photoresist layer to implement etching the oxide semiconductor layer for patterning the oxide semiconductor layer to respectively obtain a first oxide semiconductor layer, a second oxide semiconductor layer respectively above the first bottom gate, the second bottom gate and a third oxide semiconductor layer at the one side of the first bottom gate away from the second bottom gate;
   step 4, first, removing the two side areas of the first photoresist layer, the two side areas of the second photoresist layer and the third photoresist layer; employing the remaining middle area of the first photoresist layer and the remaining middle area of the second photoresist layer as being a mask layer to implement ion doping to the two side areas of the first oxide semiconductor layer, the two side areas of the second oxide semiconductor layer and the third oxide semiconductor layer, to transform the two side areas of the first oxide semiconductor layer and the two side areas of the second oxide semiconductor layer to be a conductor, and to transform the third oxide semiconductor layer to be an oxide conductor layer; then, removing the remaining middle area of the first photoresist layer and the remaining middle area of the second photoresist layer;
   step 5, depositing a top gate isolation layer on the first oxide semiconductor layer, the second oxide semiconductor layer, the oxide conductor layer and the bottom gate isolation layer, and implementing pattern process to the top gate isolation layer and the bottom gate isolation layer with a third photo process, to respectively form first via holes above the two side areas of the first oxide semiconductor layer, second via holes above the two side areas of the second oxide semiconductor layer, a third via hole above the oxide conductor layer and a fourth via hole between the first bottom gate and the second bottom gate to expose a portion of the first bottom gate;
   step 6, depositing second, third metal layers on the top gate isolation layer, and implementing pattern process to the second, third metal layers with a fourth photo process, to respectively obtain a first top gate above the first oxide semiconductor layer, a first source and a first drain at two sides of the first top gate, a second top gate above the second oxide semiconductor layer and a second source and a second drain at two sides of the second top gate;
   the first source and the first drain respectively contact with the two side areas of the first oxide semiconductor layer through the first via holes, and the second source and the second drain respectively contact with the two side areas of the second oxide semiconductor layer through the second via holes, and the first source contacts with the oxide conductor layer through the third via hole and the second source contacts with the first bottom gate through the fourth via hole;
   step 7, depositing a passivation layer on the first top gate, the first source, the first drain, the second top gate, the second source, the second drain and the top gate isolation layer;
   step 8, depositing a flat layer on the passivation layer, and implementing patterning process to the flat layer, the passivation layer and the top gate isolation layer at the same time with a fifth photo process to obtain a fifth via hole above the oxide conductor layer to expose a portion of the oxide conductor layer to define a shape of a light emitting layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

2. The manufacture method of the dual gate oxide semiconductor TFT substrate according to claim 1, wherein the step 3 utilizes physical vapor deposition for deposing the transparent oxide semiconductor layer.

3. The manufacture method of the dual gate oxide semiconductor TFT substrate according to claim 1, wherein the step 5 utilizes dry etching for implementing pattern process to the top gate isolation layer and the bottom gate isolation layer at the same time.

4. The manufacture method of the oxide semiconductor TFT substrate according to claim 1, wherein material of the oxide semiconductor layer is IGZO.

5. The manufacture method of the dual gate oxide semiconductor TFT substrate according to claim 1, wherein material of the flat layer is organic photoresist.

6. The manufacture method of the dual gate oxide semiconductor TFT substrate according to claim 1, wherein material of the first bottom gate, the first top gate, the first source, the first drain, the second bottom gate, the second top gate, the second source and the second drain is a stack combination of one or more of molybdenum, titanium, aluminum and copper.

7. The manufacture method of the dual gate oxide semiconductor TFT substrate according to claim 1, wherein material of the bottom gate isolation layer and the top gate isolation layer is Silicon Nitride, Silicon Oxide, or a combination of the two.

* * * * *